United States Patent
Yang

(10) Patent No.: US 8,316,923 B2
(45) Date of Patent: Nov. 27, 2012

(54) HEAT DISSIPATION DEVICE

(75) Inventor: Jian Yang, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 624 days.

(21) Appl. No.: 12/565,771

(22) Filed: Sep. 24, 2009

(65) Prior Publication Data

US 2010/0243219 A1    Sep. 30, 2010

(51) Int. Cl.
*F24H 3/06*  (2006.01)
*F28F 7/02*  (2006.01)

(52) U.S. Cl. .................................... 165/121; 165/80.3
(58) Field of Classification Search .............. 165/80.1, 165/80.3, 121, 133; 361/697
See application file for complete search history.

(56) References Cited

U.S. PATENT DOCUMENTS

| | | | | |
|---|---|---|---|---|
| 6,404,632 B1 * | 6/2002 | Forkas | ........................ | 361/703 |
| 6,469,898 B1 * | 10/2002 | Rouchon | ...................... | 361/709 |
| 6,497,273 B1 * | 12/2002 | Horng et al. | ................ | 165/80.3 |
| 7,342,795 B2 * | 3/2008 | Lee et al. | ..................... | 361/719 |

* cited by examiner

*Primary Examiner* — Teresa Walberg
(74) *Attorney, Agent, or Firm* — Altis Law Group, Inc.

(57) ABSTRACT

A heat dissipation device includes a heat sink, a plurality of fasteners extending through the heat sink, a fan holder mounted on the heat sink and a fan secured on the fan holder. The heat sink includes multiple claws to retain the fasteners therein. The fan holder includes a hoop surrounding the heat sink and a bracket supporting the fan. A plurality of sleeves are formed on the hoop and aligned with the claws of the heat sink, to thereby guide a tool to manipulate the fasteners to secure the heat sink to a printed circuit board.

15 Claims, 3 Drawing Sheets

HEAT DISSIPATION DEVICE

BACKGROUND

1. Technical Field

The present disclosure relates to a heat dissipation device, and more particularly, to a heat dissipation device having a guiding structure for guiding a tool so that the tool can be reliably manipulated during assembly of the heat dissipation device to a printed circuit board.

2. Description of Related Art

Electronic components generate a large amount of heat during operation. In order to ensure normal operation of the electronic components, heat dissipation devices are desired to closely engage with the electronic components to remove the heat from the electronic components. A heat dissipation device generally includes a base in contact with an electronic component and a plurality of fins extending from the base to dissipate heat. The base is designed to have multiple through holes defined therein. Fasteners, such as screws, are extended through the through holes of the base into a printed circuit board where the electronic component is mounted, to thereby secure the heat dissipation device on the electronic component.

For some types of the fasteners, it is difficult to manipulate them just by hand. Therefore, various tools, such as screwdriver, are used to facilitate manipulation of the fasteners. By coincidentally fitting into slots of the fasteners, the screwdriver could conveniently drive the fasteners to engagingly rotate into the printed circuit board. However, during rotation of the fasteners, the screwdriver is prone to slide and thus fall off from the fasteners if the force acting on the screwdriver is not controlled properly. The fallen screwdriver may collide other electronic components on the printed circuit board, resulting in unexpected damage of the printed circuit board.

What is needed, therefore, is a heat dissipation device which can overcome the above-mentioned disadvantages.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
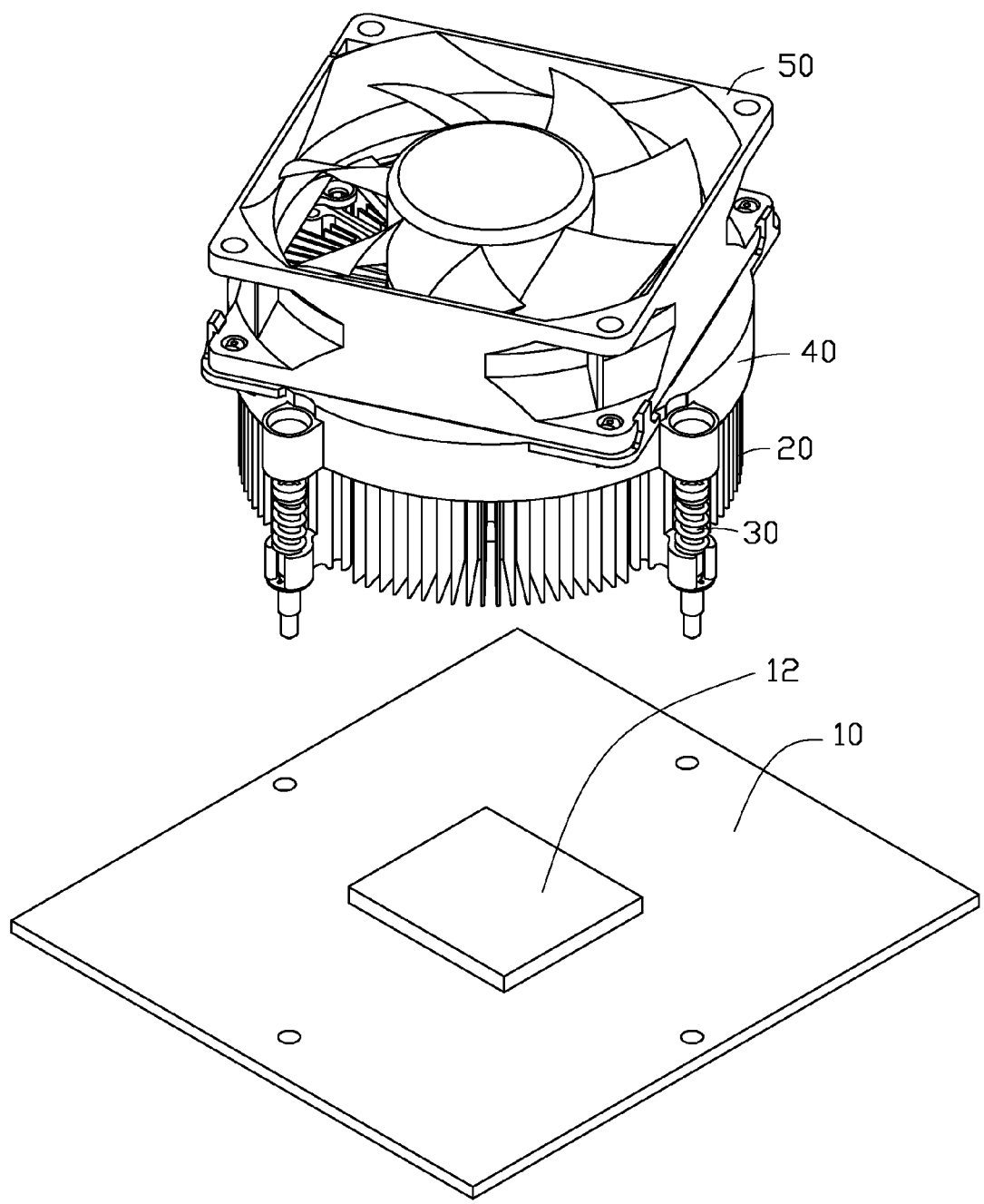
FIG. 1 is an assembled view of a heat dissipation device of this disclosure, wherein a printed circuit board with an electronic component is placed below the heat dissipation device.
Figure 2:
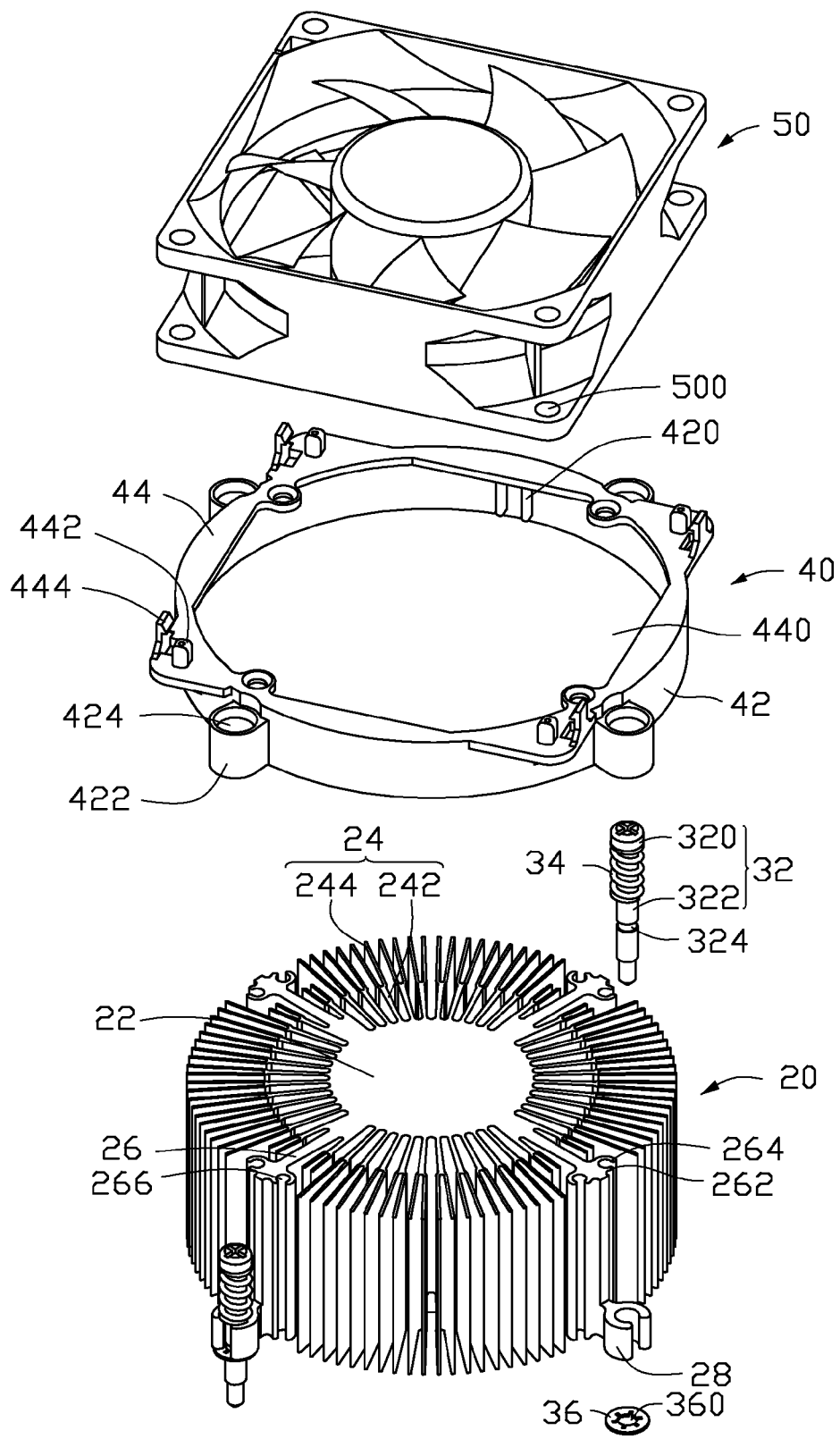
FIG. 2 is an exploded view of the heat dissipation device of FIG. 1.

Referring to FIGS. 1-2, a heat dissipation device of the present disclosure is disclosed. The heat dissipation device is mounted on a printed circuit board 10 to contact an electronic component 12 on the printed circuit board 10. The heat dissipation device comprises a heat sink 20 in thermal contact with the electronic component 12, four fasteners 30 retained in the heat sink 20, a fan holder 40 mounted on a top of the heat sink 20, and a fan 50 secured on the fan holder 40.

The heat sink 20 is integrally made of metal or other heat-conductive materials. Preferably, the heat sink 20 is formed by aluminum extrusion. The heat sink 20 comprises a column 22, four branches 26 extending radially from a circumferential periphery of the column 22, and a plurality of fins 24 extending radially from the circumferential periphery of the column 22 and positioned between the four branches 26. The column 22 thermally contacts with the electronic component 12 via a thermal interface material to absorb heat from the electronic component 12. The four branches 26 evenly divide a space surrounding the circumferential periphery of the column 22 into four identical areas. Each branch 26 has a width larger than that of each fin 24, to thereby provide a supportive structure with a sufficient strength to the fastener 30 connected thereto. Each branch 26 comprises a rectangular plate (not labeled) coupled to the column 22, a pair of symmetrical, flat tabs 262 extending laterally and oppositely from two opposite lateral sides of the plate, and a pair of symmetrical, arced flanges 264 extending laterally and oppositely from the two opposite lateral sides of the plate. With respect to the pair of flanges 264, the pair of tabs 262 are located more adjacent to an outside of the heat sink 20. Each flange 264 is curvedly extended, with a laterally outward end extending towards a neighboring tab 262, to thereby surround a columnar slot 266 between the flange 264 and the neighboring tab 262. Two confronting distal extremities of the flange 264 and the neighboring tab 262 are spaced a distance from each other, whereby the slot 266 is half-opened to enable a corresponding element to be easily inserted to the slot 266. Each branch 26 has a claw 28 horizontally formed near a bottom of a distal end thereof. The claw 28 has two curved arms (not labeled) connected together to the branch 26 at a location approximate to the branch 26, and spaced from each other at a location away from the branch 26. The claw 28 is for receiving the fastener 30 therein to supportively hold the fastener 30 in the heat sink 20. The fins 24 are located in the four areas between the four branches 26. Each fin 24 has a sheet 242 connected to the column 22 and a pair of pieces 244 bifurcated from the sheet 242 outwardly.

The fasteners 30 are extended through the claws 28 of the heat sink 20. Each fastener 30 comprises a screw 32 and a spring 34 enclosing the screw 32. The screw 32 has a head 320 and a pole 322 extending downwardly from the head 320. An annular groove 324 is defined near a middle of the pole 322. A gasket 36 having a hole 360 in a center thereof is provided below the claw 28 to snap the screw 32 at the groove 324 thereof, to thereby confine the screw 32 from falling off the claw 28. The fasteners 30 are used for securing the heat sink 20 on the printed circuit board 10 in a manner that the pole 322 of the screw 32 extends through the claw 28 of the heat sink 20, a bottom end of the screw 32 is engaged in the printed circuit board 10, and the spring 34 is compressed between the head 320 of the screw 32 and the claw 28 to press the heat sink 20 towards the printed circuit board 10.

Figure 3:
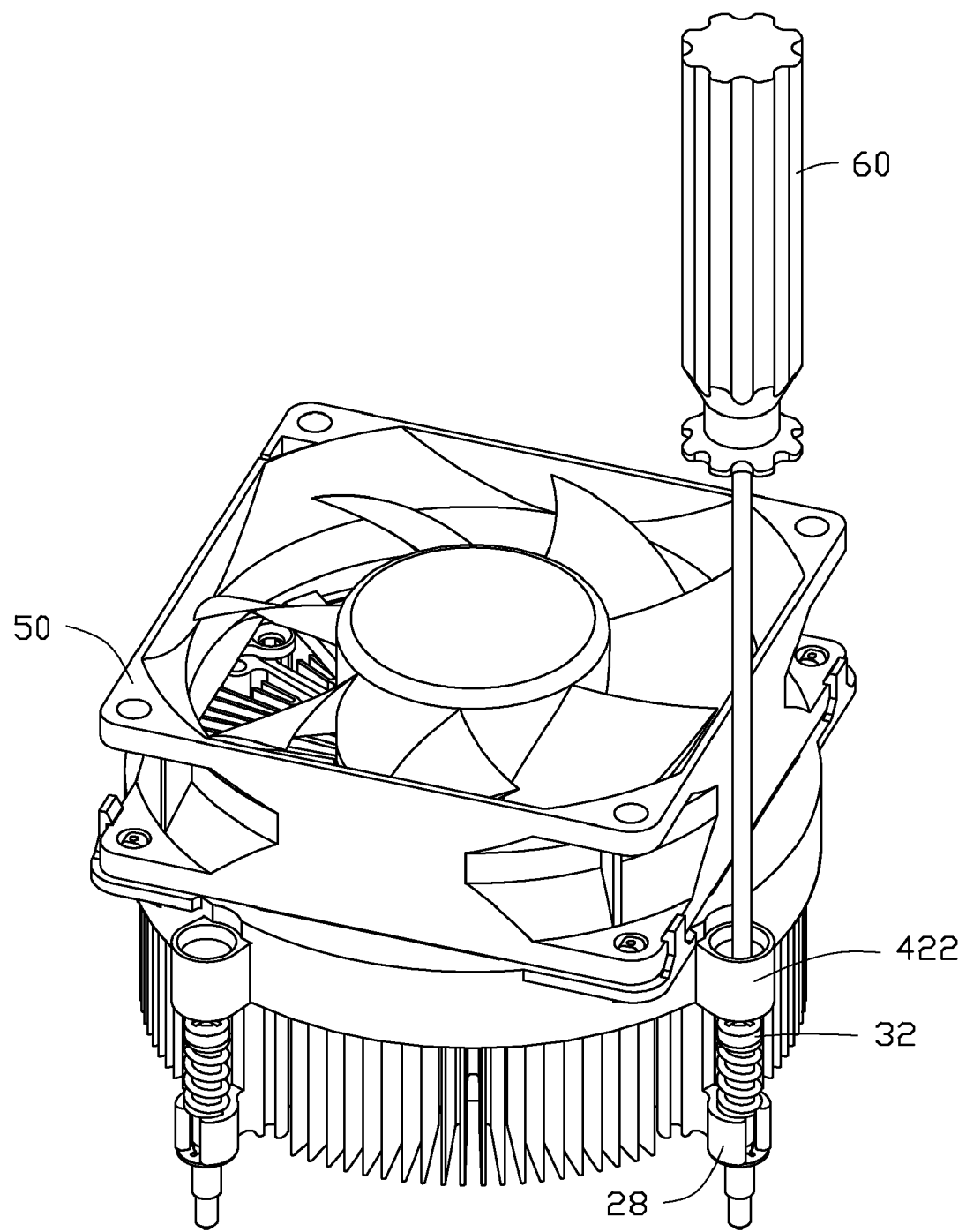
FIG. 3 shows fasteners of the heat dissipation device being manipulated by a screwdriver.

Also referring to FIG. 3, the fan holder 40 is mounted atop the heat sink 20. The fan holder 40 comprises a hoop 42 hooping the heat sink 20 and a bracket 44 formed atop the hoop 42. Four pairs of upright ribs 420 are extended on an inner circumference of the hoop 42 (only one pair of ribs 420 shown in FIG. 2). The ribs 420 are for insertion to the slots 266 in the branches 26, to thereby secure the fan holder 40 on the heat sink 20. Four sleeves 422 each having a through hole 424 defined therein, are extended on an outer circumference of the hoop 42. The four sleeves 422 are aligned with the four claws 28 of the heat sink 20, respectively. The sleeves 422 are for providing guidance of a tool 60 (a screwdriver in the present embodiment) to reliably manipulate the fasteners 30 when assembling the heat dissipation device on the printed circuit board 10. The tool 60 extends through the through hole 424 of the sleeve 422 to rotate the screw 32 extending through the claw 28. Even the tool 60 is brought to slide from screw 32 of the fastener 30 accidentally, the tool 60 would be still limited by the sleeve 422 from colliding the printed circuit board 10, thereby ensuring safety of the printed circuit board 10.

The bracket 44 is rectangular and defines an opening 440 in a center thereof for allowing an airflow generated by the fan 50 blowing the heat sink 20. The four sleeves 422 on the hoop 42 protrude outward beyond a periphery of the bracket 44, thereby preventing the bracket 44 from blocking ways of the tool 60 into the sleeves 422. The bracket 44 has four protrusions 442 formed at four corners thereof, and four buckles 444 located neighboring the four protrusions 442, respectively. Each buckle 444 has a locking tip (not labeled) facing the protrusion 442 located adjacent thereto. The protrusions 442 together with the buckles 444 secure the fan 50 on the fan holder 40, wherein the protrusions 442 are inserted to through holes 500 defined in four corners of the fan 50, and the buckles 444 are locked with a periphery of the fan 50 in a manner that the locking tips of the buckles 444 abut against a top face of a lower board of the fan 50.

It is believed that the present disclosure and its advantages will be understood from the foregoing description, and it will be apparent that various changes may be made thereto without departing from the spirit and scope of the present disclosure or sacrificing all of its material advantages, the examples hereinbefore described merely being preferred or exemplary embodiments.

The invention claimed is:

1. A heat dissipation device comprising:
a heat sink;
a plurality of fasteners extending through the heat sink; and
a frame mounted to the heat sink;
wherein the frame has a plurality of sleeves in alignment with the fasteners, respectively;
wherein the frame comprises a hoop hooping the heat sink, and the sleeves are formed at an outer circumference of the hoop of the frame; and
wherein the heat sink comprises a column, a plurality of branches extending radially from the column, and a plurality of fins extending radially from the column and located between the branches, the hoop of the frame surrounding the fins of the heat sink.

2. The heat dissipation device as claimed in claim 1, wherein the fasteners are located adjacent to a bottom of the heat sink, and the sleeves are located near a top of the heat sink.

3. The heat dissipation device as claimed in claim 1, wherein the frame further comprises a bracket located atop the hoop, the bracket supporting a fan thereon.

4. The heat dissipation device as claimed in claim 3, wherein the bracket has a plurality of protrusions inserted into the fan.

5. The heat dissipation device as claimed in claim 4, wherein the bracket has a plurality of buckles locked with a periphery of the fan.

6. The heat dissipation device as claimed in claim 1, wherein each of the branches comprises a plate connected to the column, a pair of tabs and a pair of flanges extending laterally and oppositely from two opposite sides of the plate.

7. The heat dissipation device as claimed in claim 6, wherein the pair of flanges are curved toward the pair of tabs, respectively, the pair of flanges and the pair of tabs cooperatively surrounding two slots at two flanks of the plate.

8. The heat dissipation device as claimed in claim 7, wherein the hoop of the frame has a plurality of ribs formed on an inner circumference thereof, the ribs being received in the slots of the heat sink, respectively.

9. The heat dissipation device as claimed in claim 1, wherein the heat sink further comprises a plurality of claws formed on the branches, and the fasteners are retained in the claws, respectively.

10. The heat dissipation device as claimed in claim 9, wherein each of the fasteners comprises a screw extending through the claw and a spring compressed between the claw and the screw.

11. The heat dissipation device as claimed in claim 1, wherein each of the plurality of fins comprises a sheet connected to the column and two pieces bifurcated outwardly from the sheet.

12. A heat dissipation device comprising:
a heat sink having a plurality of arms; and
a plurality of fasteners supported by the arms, respectively;
wherein a plurality of sleeves are provided between a tool and the fasteners to guide the tool to manipulate the fasteners, respectively; and
wherein the sleeves are formed on a fan holder secured on the heat sink, the fan holder supporting a fan thereon.

13. The heat dissipation device as claimed in claim 12, wherein the fan holder comprises a hoop surrounding the heat sink and a bracket connected to the fan, the bracket defining an opening for allowing airflow generated by the fan to blow the heat sink.

14. The heat dissipation device as claimed in claim 13, wherein the sleeves protrude from the hoop outwardly beyond a periphery of the bracket.

15. A heat dissipation device comprising:
a heat sink;
a plurality of fasteners extending through the heat sink; and
a frame mounted to the heat sink;
wherein the frame has a plurality of sleeves in alignment with the fasteners, respectively;
wherein the frame comprises a hoop hooping the heat sink, and the sleeves are formed at an outer circumference of the hoop of the frame;
wherein the frame further comprises a bracket located atop the hoop, the bracket supporting a fan thereon; and
wherein the bracket has a plurality of protrusions inserted into the fan.

* * * * *

UNITED STATES PATENT AND TRADEMARK OFFICE
CERTIFICATE OF CORRECTION

PATENT NO. : 8,316,923 B2  
APPLICATION NO. : 12/565771  
DATED : November 27, 2012  
INVENTOR(S) : Jian Yang Page 1 of 1

It is certified that error appears in the above-identified patent and that said Letters Patent is hereby corrected as shown below:

Title Page, below Item (22) insert

-- (30)  Foreign Application Priority Data

Mar. 31, 2009   (CN) ......................200910301247.6 --

Signed and Sealed this
Twenty-ninth Day of October, 2013

Teresa Stanek Rea
*Deputy Director of the United States Patent and Trademark Office*